(12) United States Patent
Kawaguchi (10) Patent No.: US 10,129,985 B2
(45) Date of Patent: Nov. 13, 2018

(54) SUBSTRATE COVER

(71) Applicant: NuFlare Technology, Inc., Yokohama-shi (JP)

(72) Inventor: Michihiro Kawaguchi, Mishima (JP)

(73) Assignee: NuFlare Technology, Inc., Yokohama-shi (JP)

( * ) Notice: Subject to any disclaimer, the term of this patent is extended or adjusted under 35 U.S.C. 154(b) by 469 days.

(21) Appl. No.: 14/874,554

(22) Filed: Oct. 5, 2015

(65) Prior Publication Data

US 2016/0105945 A1  Apr. 14, 2016

(30) Foreign Application Priority Data

Oct. 8, 2014  (JP) .................................. 2014-207255

(51) Int. Cl.
| | | |
|---|---|---|
| *H01H 47/00* | (2006.01) | |
| *H05F 3/00* | (2006.01) | |
| *H05F 3/02* | (2006.01) | |
| *H05K 3/00* | (2006.01) | |

(52) U.S. Cl.
CPC ... *H05K 3/0002* (2013.01); *H05K 2203/0169* (2013.01); *H05K 2203/092* (2013.01)

(58) Field of Classification Search
CPC .................................. H05F 3/02; H05K 3/027
USPC ........................................................ 361/220
See application file for complete search history.

(56) References Cited

U.S. PATENT DOCUMENTS

2016/0007447 A1*  1/2016  Funahashi ......... H01L 27/14618
348/375

FOREIGN PATENT DOCUMENTS

| JP | 2008-58809 A | 3/2008 |
|---|---|---|
| JP | 2010-74094 A | 4/2010 |
| JP | 5403981 | 1/2014 |

OTHER PUBLICATIONS

Office Action dated Aug. 9, 2016 in Korean Patent Application No. 10-2015-0137271 (with English language translation).

* cited by examiner

*Primary Examiner* — Thienvu Tran
*Assistant Examiner* — Lucy Thomas
(74) *Attorney, Agent, or Firm* — Oblon, McClelland, Maier & Neustadt, L.L.P.

(57) ABSTRACT

A substrate cover has a conductive frame body covering a surface circumference edge region and an upper circumference region of a substrate drawn with a charged particle beam, the conductive frame body comprising a notch portion provided at part of an inner circumference of the conductive frame body, and a recessed portion provided on the outer circumference side of the upper surface of the conductive frame body, such that the recessed portion is arranged adjacent to the notch portion in a direction of a frame width of the conductive frame body, and a conductive member provided on the recessed portion so as to pass through the notch portion to project inward to the inside of the frame of the conductive frame body, the conductive member comprising a contact portion electrically connected to the surface of the substrate, and a brim portion covering an upper portion of a gap.

12 Claims, 6 Drawing Sheets

SUBSTRATE COVER

CROSS REFERENCE TO RELATED APPLICATIONS

This application is based upon and claims the benefit of priority from the prior Japanese Patent Application No. 2014-207255, filed on Oct. 8, 2014, the entire contents of which are incorporated herein by reference.

FIELD

The present invention relates to a substrate cover.

BACKGROUND

In accordance with recent increase in integration and capacity of large scale integration (LSI) circuits, the widths of circuit lines required for semiconductor devices has become increasingly smaller. Lithography technique is used to form a desired circuit pattern on a semiconductor device, and pattern transfer using an original drawing pattern referred to as a mask (reticle) is performed by using the lithography technique. To produce a high accuracy mask used in the pattern transfer, a charged particle beam drawing apparatus having excellent resolution is used.

The charged particle beam drawing apparatus draws a pattern on a substrate disposed on a stage by irradiating the substrate with a charged particle beam in a deflected manner by a charged particle optical system, while moving the stage that supports the substrate such as a mask or a blank in a chamber. To improve drawing accuracy, it is desired to minimize the distance between the charged particle optical system and the substrate, and the distance is preferably set to about a few millimeters (e.g., about 2 mm).

When the drawing is performed on the substrate with a charged particle beam by using such a charged particle beam drawing apparatus, there is a possibility that a conductive material, such as resist, formed on the substrate on a light shielding layer made of chromium (Cr) or the like may be charged. If the drawing continues in this state, the trajectory of the charged particle beam would be deflected by an electric field generated by the charged substrate. As a result of this, the drawing at desired positions is prohibited and the drawing accuracy is decreased.

To suppress the decrease of the drawing accuracy, a substrate cover disposed on the substrate to prevent charging of the substrate has been developed. A frame of the substrate cover is shaped like a frame to cover the surface circumference edge region of the substrate. On the frame, a plurality of conductive plates is provided, each having a pin that touches the surface of the substrate, and these conductive plates are connected to the ground. When such a substrate cover is disposed on the substrate, the pin of the conductive plate, which is grounded, touches the surface of the substrate to prevent charging of the substrate. The substrate cover also captures scattered electrons in the vicinity of the circumference of the substrate, such that the charging near the circumference edge of the substrate can also be prevented.

However, the distance between the charged particle optical system and the substrate becomes very narrow, as described above. If the thickness of the substrate cover remains thick as it is due to the conductive plate on the flame, the conductive plate of the substrate cover disposed on the substrate touches the lower end of the charged particle optical system during drawing. As a result of this, accurate drawing becomes impossible. Further, breakage of the charged particle optical system and the substrate cover is also concerned. It has been desired, therefore, to decrease the thickness of the substrate cover.

DETAILED DESCRIPTION

According to one embodiment, a substrate cover has a conductive frame body covering a surface circumference edge region and an upper circumference region of a substrate drawn with a charged particle beam, the conductive frame body comprising a notch portion provided at part of an inner circumference of the conductive frame body, and a recessed portion provided on the outer circumference side of the upper surface of the conductive frame body, such that the recessed portion is arranged adjacent to the notch portion in a direction of a frame width of the conductive frame body, and a first conductive member provided on the recessed portion so as to pass through the notch portion to project inward to the inside of the frame of the conductive frame body, the first conductive member comprising a conductive member main body, a contact portion electrically connected to the surface of the substrate, and a brim portion covering an upper portion of a gap between an inner wall of the notch portion and the conductive member main body.

An embodiment will be described by referring to the accompanying drawings.

Figure 1:
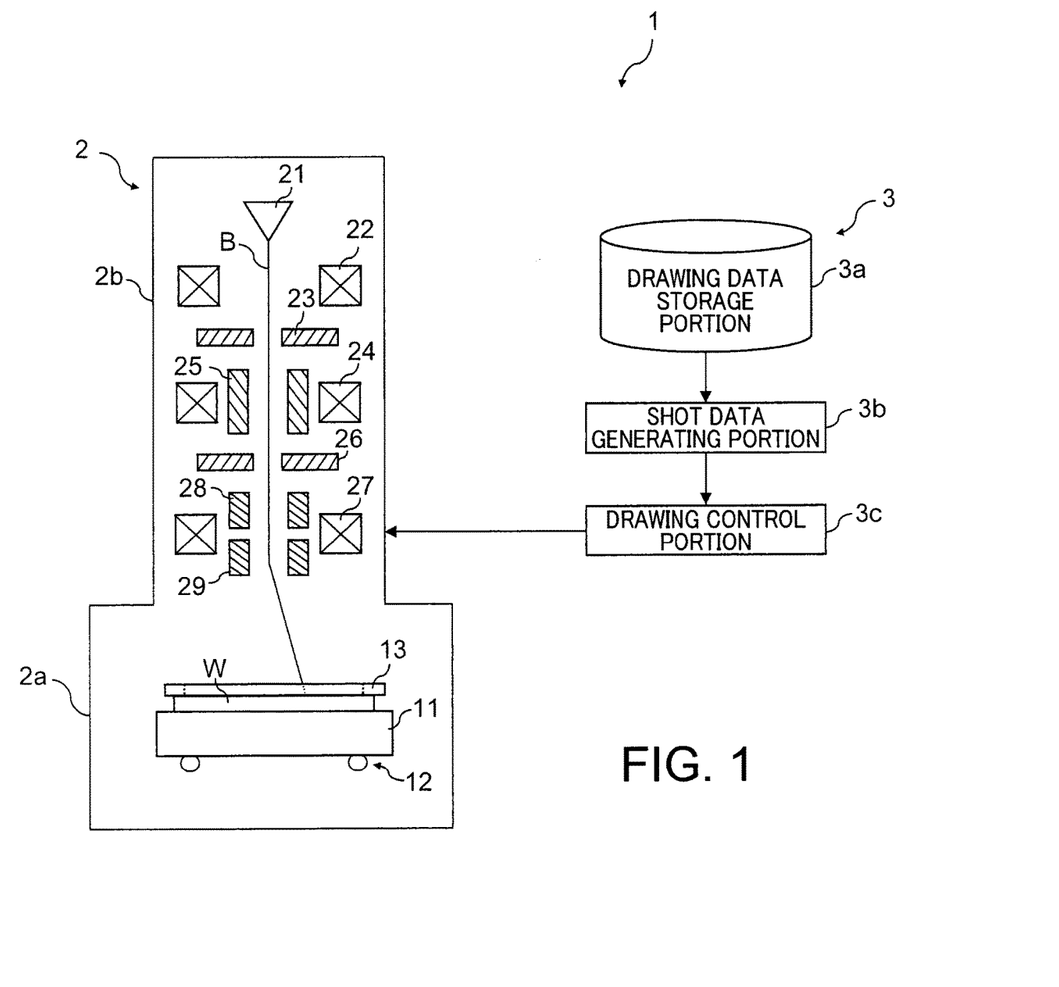
FIG. 1 is a schematic diagram illustrating the structure of a charged particle beam drawing apparatus according to an embodiment.

As illustrated in FIG. 1, a charged particle beam drawing apparatus 1 according to the embodiment is provided as an example of a variable shaping type drawing apparatus using electron beam B as a charged particle beam. The charged particle beam drawing apparatus 1 includes a drawing unit 2 in which drawing is performed with the electron beam B, and a control unit 3 that controls the drawing unit 2. The charged particle beam is not limited to the electron beam B, and other charged particle beams, such as ion beam may be used.

The drawing unit 2 includes a drawing chamber (drawing room) 2a that stores a substrate W which is subject to drawing, and an optical lens barrel 2b connected to the drawing chamber 2a. The optical lens barrel 2b is provided on the upper surface of the drawing chamber 2a to form and deflect the electron beam B by an electronic optical system (an example of the charged particle optical system) to irradiate the substrate W in the drawing chamber 2a. The drawing chamber 2a and the optical lens barrel 2b are airtight, and the internal pressures thereof are reduced to the vacuum state.

In the drawing chamber 2a, a stage 11 on which the substrate W, such as a mask or a blank, is supported, and a stage moving mechanism 12 to move the stage 11 are provided. The stage moving mechanism 12 moves the stage 11 in an X-axis direction and a Y-axis direction (hereinafter simply referred to as X-direction and Y-direction) which run perpendicularly to each other in a horizontal plane. As the substrate W, a substrate including, for example, a light shielding layer, such as chromium (Cr), on the surface of a quartz substrate and a resist layer formed on the light shielding layer is used.

A substrate cover 13 is disposed on the substrate W to prevent electron charging of the substrate W during drawing and field distortion in the drawing area of the substrate W (i.e., positional errors during drawing in the vicinity of the circumference of the substrate W). The substrate cover 13 may be disposed on the substrate W outside the drawing chamber 2a (e.g., in a storage chamber in which the substrate cover 13 is stored), for example, before the substrate W is disposed on the stage 11, and then mounted on the stage 11 together with the substrate W.

The optical lens barrel 2b includes an ejection unit 21, such as an electron gun that ejects the electron beam B, a lighting lens 22 that collects the electron beam B, a first shaping aperture 23 for shaping the beam, a projection lens 24 for projection, a shaping deflector 25 for shaping the beam, a second shaping aperture 26 for shaping the beam, an objective lens 27 that focuses the beam on the substrate W, and a sub-deflector 28 and a main deflector 29, both of which are provided to control shot positions of the beam on the substrate W. An electronic optical system is configured by these elements. A distance (clearance) between the lower end of the electronic optical system and the substrate W on the stage 11 is set to about a few millimeters (e.g., about 2 mm) to improve drawing accuracy. A width (diameter) of the lower end of the electronic optical system may differ depending on the constituent elements, and may be set to about 80 mm to 300 mm.

In the drawing unit 2, the electron beam B is ejected from the ejection unit 21 to irradiate the first shaping aperture 23 by the lighting lens 22. The first shaping aperture 23 has, for example, a rectangular opening. Therefore, when the electron beam B passes through the first shaping aperture 23, the cross-section of the electron beam B is shaped into a rectangle and the electron beam B is projected to the second shaping aperture 26 by the projection lens 24. The projecting position can be deflected by the shaping deflector 25, and changing the projecting position allows control of the shape and size of the electron beam B. After that, the electron beam B having passed through the second shaping aperture 26 is focused on and ejected to the substrate W on the stage 11 by the objective lens 27. At this time, the shot position of the electron beam B on the substrate W on the stage 11 is changeable by the sub-deflector 28 and the main deflector 29.

The control unit 3 includes a drawing data storage portion 3a that stores drawing data, a shot data generating portion 3b that generates shot data by processing the drawing data, and a drawing control portion 3c that controls the drawing unit 2. The shot data generating portion 3b and the drawing control portion 3c may be configured by hardware, such as an electric circuit, by software, such as a program that executes various functions, or by a combination thereof.

The drawing data storage portion 3a stores the drawing data for drawing a pattern on the substrate W. The drawing data is design data (layout data) created by the designer or the like of the semiconductor integrated circuit, and converted into the format for the charged particle beam drawing apparatus 1. Such data is input from an external apparatus to the drawing data storage portion 3a and stored therein. As the drawing data storage portion 3a, a magnetic disc apparatus, a semiconductor disc apparatus (flash memory) or the like may be used.

The shot data generating portion 3b divides the drawing pattern defined by the drawing data into a plurality of frame regions (with the longitudinal direction runs in the X-direction, and the short-length direction runs in the Y-direction), each frame region being a stripe-shape (in the shape of a small rectangle piece of paper). Each frame is then further divided into many sub-regions arranged in matrix. In addition, the shot data generating portion 3b determines the size, position, etc. of the pattern in each sub-region. If it is impossible to draw the pattern by one shot, the pattern is divided into a plurality of partial regions capable of being drawn to generate the shot data. The length in the short-length direction (Y-direction) of the frame region is set to such a length that can be provided by deflecting the electron beam B by main deflection.

During the drawing of the drawing pattern mentioned above, the drawing control portion 3c positions the electron beam B in each sub-region by the main deflector 29. At the same time, the stage 11 is moved in the longitudinal direction (X-direction) of the frame region by the stage moving mechanism 12, and the pattern is drawn by shooting the electron beam B to predetermined positions of the sub-region by a sub-deflector 28. When the drawing of one flame region is completed, the stage 11 is moved stepwise in the Y-direction before drawing in the next frame region. This is repeated until the drawing with the electron beam B is completed for the entire drawing region of the substrate W (which is an example of a drawing operation). Since the stage 11 is continuously moved in one direction during the drawing, the original point of the drawing in the sub-region is tracked by the main deflector 29 such that the original point of the drawing can follow the movement of the stage 11.

The electron beam B is thus deflected by the sub-deflector 28 and the main deflector 29, and the irradiation position of the electron beam B is determined while following the continuously moved stage 11. By continuously moving the stage 11 in the X-direction and allowing the shot position of the electron beam B to follow the movement of the stage 11, the drawing time can be decreased. Although the stage 11 is moved continuously in the X-direction in the first embodiment, it is not limited thereto. Alternatively, the drawing may be performed in a step-and-repeat method in which the drawing of a sub-region is performed while the stage 11 is stopped, and the drawing is skipped when the stage 11 is moved to the next sub-region.

Next, the substrate cover 13 will be described in detail below by referring to FIGS. 2 to 8.

Figure 2:
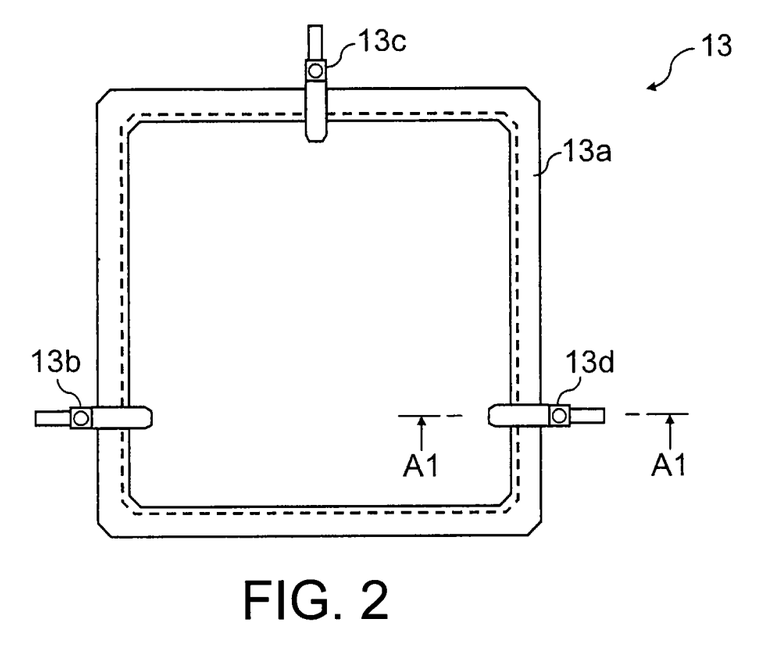
FIG. 2 is a plan view schematically illustrating the structure of a substrate cover according to the embodiment.

As illustrated in FIG. 2, the substrate cover 13 includes a frame-like conductive frame body (conductive frame) 13a whose shape corresponds to the peripheral shape of the substrate W, and a plurality of (three in FIG. 2) electrode portions 13b, 13c, and 13d that are in contact with the surface of the substrate W. These electrode portions 13b, 13c, and 13d act as supporting portions to support the conductive frame body 13a at three points in the storage chamber or the like before the substrate cover 13 is disposed on the substrate W. Therefore, these electrode portions 13b, 13c, and 13d are arranged in such a manner that the load of the conductive frame body 13a is distributed substantially uniformly.

Figure 3:
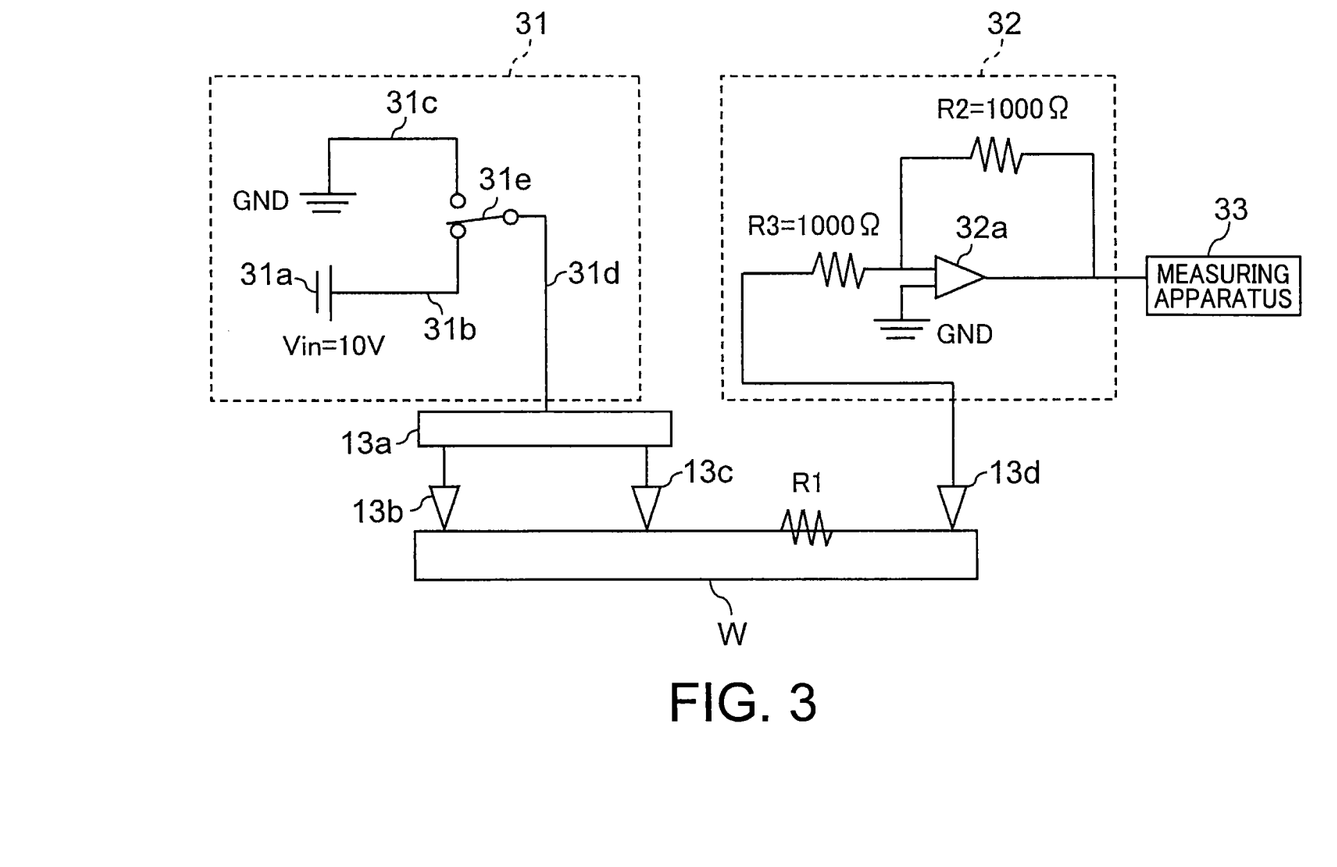
FIG. 3 is an explanatory diagram for explaining conduction confirmation between electrode portions of the substrate cover and the substrate according to the embodiment.

As illustrated in FIG. 3, all of the three electrode portions 13b, 13c, and 13d are in point contact with the surface of the substrate W in a state where the substrate cover 13 is placed on the substrate W. Of the electrode portions, two electrode portions 13b and 13c are electrically connected with the conductive frame body 13a, while the electrode portion 13d is insulated from the conductive frame body 13a. The electrode portion 13d acts as a conduction confirming portion to confirm whether at least one of the two electrode portions 13b and 13c is electrically connected with the surface of the substrate W while the substrate cover 13 is placed on the substrate W.

The two electrode portions 13b and 13c are connected to a first electric circuit 31 via the conductive frame body 13a. The first electric circuit 31 includes a power source 31a, a power wiring 31b connected to the power source 31a, a ground wiring 31c connected to the ground, a conductive wiring 31d connected to the conductive frame body 13a, and a switch 31e that switches between grounding and voltage application of the conductive frame body 13a. At time other than confirming the conduction between the electrode portion 13b or 13c and the substrate W, the ground wiring 31c and the conductive wiring 31d are connected via the switch 31e, and both of the electrode portions 13b and 13c are grounded together with the conductive frame body 13a.

The electrode portion 13d is not connected to the conductive frame body 13a, but is connected to a second electric circuit 32. The second electric circuit 32 is formed by resistance R2, R3 and an inverted amplifying type operational amplifier 32a, and connected to a measuring apparatus 33 for measuring voltages. A voltage applied between the electrode portion 13b or 13c and the electrode portion 13d is amplified by the second electric circuit 32 and measured by the measuring apparatus 33.

To confirm conduction mentioned above, the power wiring 31b is connected to the conductive wiring 31d by the switch 31e. Accordingly, a voltage is applied between the electrode portion 13b or 13c and the electrode portion 13d. At this time, if at least one of the electrode portions 13b and 13c is in contact with the surface of the substrate W, the voltage can be measured by the measuring apparatus 33. For example, an output voltage is amplified by the second electric circuit 32 and measured by the measuring apparatus 33. From the measured value, it is determined whether at least one of the electrode portions 13b and 13c is electrically connected with the surface of the substrate W.

Figure 4:
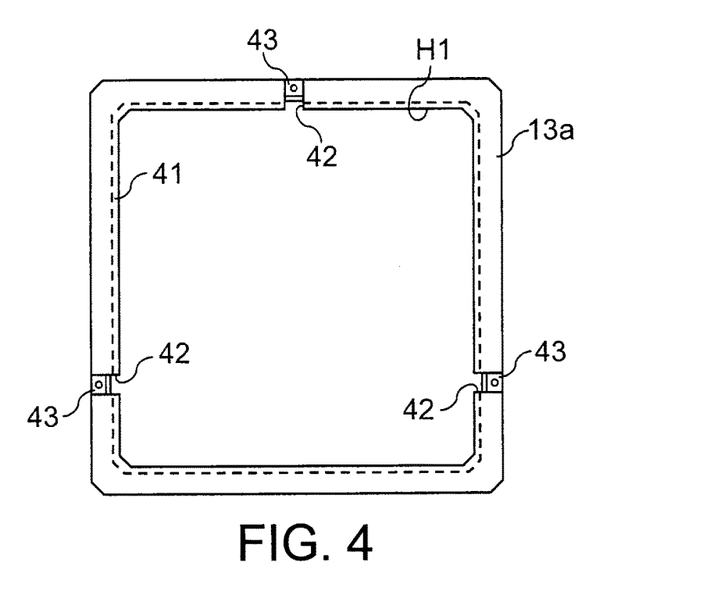
FIG. 4 is a plan view illustrating a conductive frame body of the substrate cover according to the embodiment.

As illustrated in FIG. 4, the conductive frame body 13a has an opening H1, from which the drawing region of the substrate W is exposed, and is shaped like a frame to cover at least a surface circumference edge region of the substrate W and an upper circumference region (upper circumference region) of the substrate W. The conductive frame body 13a includes a canopy portion 41 that covers the surface circumference edge region of the substrate W, a plurality of notch portions 42 that are arranged in the inner circumference of the frame, and a plurality of recessed portions 43 arranged on the outer circumference side of the frame and individually arranged adjacent to each of the notch portions 42. The recessed portions 43 are arranged along the inner wall of each of the notch portions 42.

The canopy portion 41 is formed to follow the frame shape of the conductive frame body 13a, and extends to the side of the substrate W to cover the peripheral region (e.g., peripheral insulating region) of the surface of the substrate W. The notch portions 42 are formed by partly cutting the conductive frame body 13a including the canopy portion 41 and arranged on the inner circumference of the frame. Thus, the notch portions 42 are provided separately at corresponding portions of the inner circumference of the conductive frame body 13a. The recessed portions 43 are arranged adjacent to the notch portions 42, respectively, in a direction of the frame width of the conductive frame body 13a, and formed to be connected to the notch portions 42 on the outer circumference side of the upper surface of the conductive frame body 13a. The frame width does not indicate the entire width of the frame body, but represents the width contributing to the thickness of the frame body, that is, the width of a member that constitutes a side of the frame body.

Figure 5:
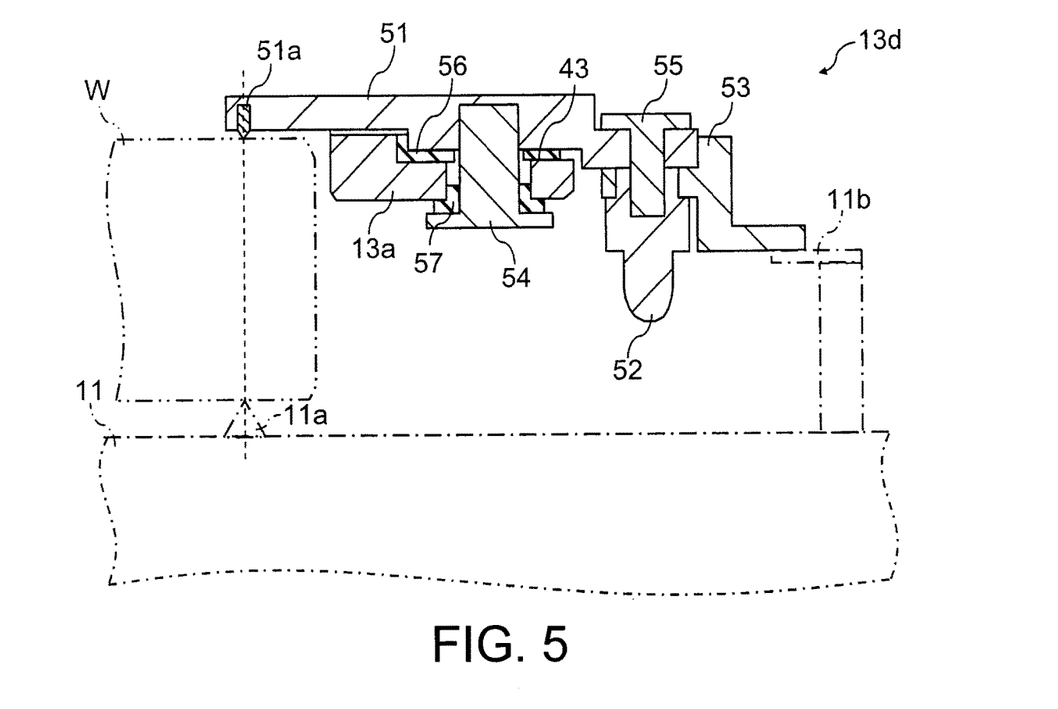
FIG. 5 is a cross-sectional view (cut along line A1-A1 of FIG. 2) illustrating an electrode portion of the substrate cover according to the embodiment.
Figure 6:
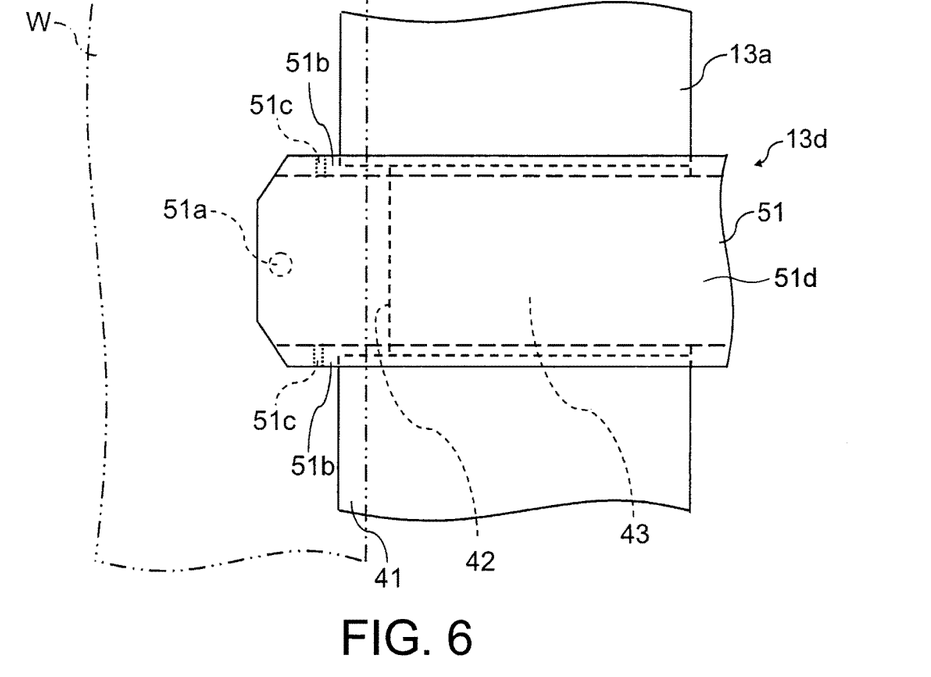
FIG. 6 is a plan view illustrating a part of a conductive member of the electrode portion in an enlarged manner according to the embodiment.
Figure 7:
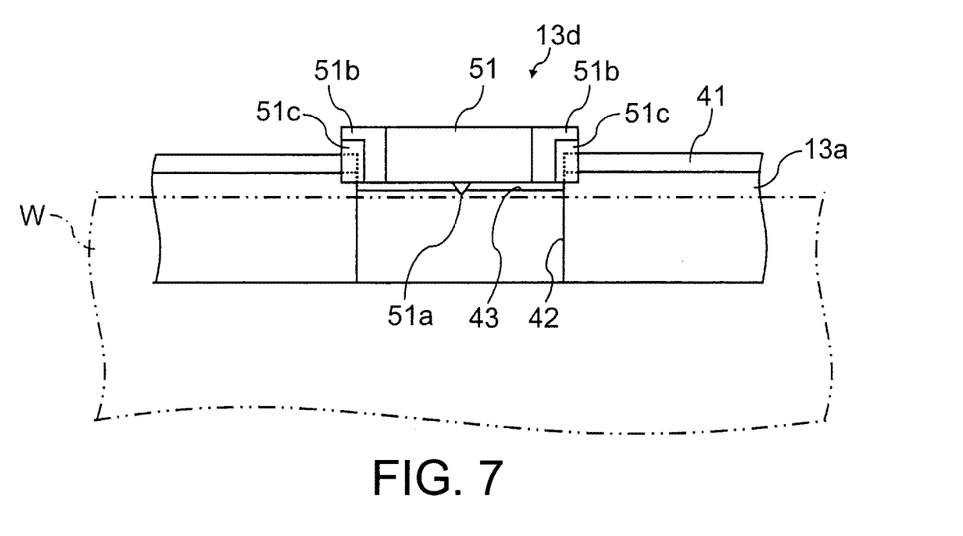
FIG. 7 is a front view (seen from the substrate side) illustrating a part of the conductive member of the electrode portion in an enlarged manner according to the embodiment.

As illustrated in FIGS. 5 to 7, the electrode portion 13d includes a conductive member (a conductive member main body, a conductive plate) 51, a support member 52 that supports the conductive frame body 13a, a connection member 53 for establishing an external electrical connection, a first fixing member 54 that fixes the conductive member 51 to the conductive frame body 13a, and a second fixing member 55 that fixes the support member 52 and the connection member 53 to the conductive member 51.

The conductive member 51 is provided, as illustrated in FIG. 5, in the recessed portion 43 of the conductive frame body 13a via a first insulation member (insulation sheet, resin sheet) 56, and insulated from the conductive frame body 13a. The conductive member 51 is formed in a plate shape, such as a rectangular shape, that covers at least the surface circumference edge region of the substrate W that is exposed from the notch portion 42. The conductive member 51 is thus provided on the recessed portion 43 so as to project toward the notch portion 42 and inward to the inside of the frame of the conductive frame body 13a. The conductive member 51 includes a conductive member main body 51d, a contact portion 51a, such as a pin, that touches the surface of the substrate W, a brim portion 51b (see FIGS. 6 and 7) that extends toward the side of the conductive frame body 13a to cover a gap up to the conductive frame body 13a, and a bank portion 51c (see FIGS. 6 and 7) that covers a gap up to the tip end surface of the conductive frame body 13a on the side of the substrate W. The conductive member 51 extends on the surface of the substrate W for a length longer than the length necessary to cover the surface circumference edge region of the substrate W exposed from the notch portion 42, and allowing the contact portion 51a to be in contact with the surface circumference edge region of the substrate W.

As illustrated in FIG. 5, the contact portion 51a is provided at the end of the conductive member 51 on the side of the substrate W, that is, at a portion of the conductive member 51 projecting inward to the inside of the frame of the conductive frame body 13a. The tip end of the contact portion 51a is formed to touch the surface of the substrate W. The contact portion 51a touches the surface of the substrate W, while the substrate cover 13 disposed on the substrate W, or penetrates through the resist layer on the substrate W to touch the light shielding layer. Thus, the contact portion 51a is electrically connected to the surface of the substrate W. The contact portion 51a is also arranged on the same line as a support pin 11a of a plurality of support pins (support points) 11*a* that support the substrate W from behind, while the substrate W covered by the substrate cover 13 is disposed on the stage 11. Thus, the contact portion 51*a* touches a position (opposing point) facing the support pin 11*a* on the surface of the substrate W.

The brim portion 51*b* is provided, as illustrated in FIGS. 6 and 7, at both ends of the conductive member 51 on the side of the upper surface in the short-length direction. The brim portion 51*b* is thus formed along the longitudinal direction of the conductive member 51. That is, the brim portion 51*b* extends in the direction of frame width of the conductive frame body 13*a*. The brim portion 51*b* extends toward the side of the conductive frame body 13*a* substantially horizontally to cover a gap (e.g., a gap of about 0.2 mm to 0.5 mm) up to the conductive frame body 13*a*, to thereby prevent entrance of electrons into the gap. Specifically, to prevent electron irradiation on the upper part of the gap (first gap) between the inner wall of the notch portion 42 and the conductive member 51, and further to prevent, as needed, electron irradiation of the first insulation member 56, the brim portion 51*b* covers the upper part of the gap (second gap) between the inner wall (inner surface) of the recessed portion 43 and the conductive member 51. If, therefore, the first insulation member 56 is sufficiently small relative to the recessed portion 43, it may not be necessary to provide the brim portion 51*b* on the recessed portion 43. When the conductive member (second conductive member, conductive sheet) is provided in place of the first insulation member 56, it is not necessary to provide shielding, nor provide the brim portion 51*b* on the recessed portion 43.

As illustrated in FIGS. 6 and 7, the bank portion 51*c* is provided at the end of the conductive member 51 on the side of the substrate W, and is formed under the brim portion 51*b* to extend perpendicularly to the longitudinal direction of the brim portion 51*b*. The bank portion 51*c* covers the gap (e.g., a gap of about 0.2 mm to 0.5 mm) up to the tip end surface of the conductive frame body 13*a* on the side of the substrate W to prevent entering of electrons into the gap. Specifically, the bank portion 51*c* covers the inner circumference side (third gap) of the conductive frame body 13*a* of the gap between the inner wall of the notch portion 42 and the conductive member main body 51*d*.

By referring to FIG. 5 again, the support member 52 acts as one of the support points of three support points that support the conductive frame body 13*a* in the storage chamber or the like before the substrate cover 13 is disposed on the substrate W. The lower end portion of the support member 52 is formed in a hemispherical shape.

The connection member 53 touches a leaf spring 11*b* placed on the stage 11 when the substrate W covered by the substrate cover 13 is mounted on the stage 11. The leaf spring 11*b* is electrically connected to the second electric circuit 32. Therefore, the conductive member 51 is electrically connected to the second electric circuit 32 via the connection member 53 and the leaf spring 11*b*.

The first fixing member 54 enters the conductive frame body 13*a* from behind and penetrates therethrough to proceed halfway through the inside of the conductive member 51. Accordingly, the conductive member 51 is fixed to the conductive frame body 13*a*. The first fixing member 54 is insulated from the conductive frame body 13*a* by the second insulation member (such as an insulation sheet, a resin sheet) 57. A bolt or the like may be used as the first fixing member 54.

The second fixing member 55 enters the conductive member 51 from the upper surface thereof and penetrates through the conductive member 51 and the connection member 53 to proceed halfway through the inside of the support member 52. Accordingly, the support member 52 and the connection member 53 are fixed to the conductive member 51. A bolt or the like may be used as the second fixing member 55.

The upper surface of the second fixing member 55 is located lower than the surface of the conductive frame body 13*a* of the conductive member 51. Specifically, a downward step is formed at the end of the conductive member 51 opposite to the side of the substrate W. The second fixing member 55 is provided at the step in such a manner that the upper surface of the second fixing member 55 is located lower than the surface of the conductive frame body 13*a* in the conductive member 51. As illustrated in FIG. 5, the bottommost surface of the conductive member 51 is located at a position lower than the uppermost surface of the conductive frame body 13*a*. Furthermore, the conductive frame body 13*a* is provided with a plurality of notch portions 42 and the respective recessed portions 43, and the conductive member is provided at each of the recessed portions 43 corresponding to the notch portions.

The conductive member 51, the support member 52, the connection member 53, the first fixing member 54, and the second fixing member 55, as described above, are made of conductive materials. Such materials may include non-magnetic metals (e.g., titanium alloy), conductive ceramics, ceramics-coated conductive materials, and so on.

Structures of other electrode portions 13*b* and 13*c* are substantially the same as the structure of the electrode portion 13*d* described above. In other electrode portions 13*b* and 13*c*, however, one or both of the first insulation member 56 and the second insulation member 57 of the electrode portion 13*d* has been replaced by members (conductive members such as conductive sheets) having conductive property, such that the electrode portions 13*b* and 13*c* are electrically connected to the conductive frame body 13*a*.

Therefore, when the conductive frame body 13*a* is directly connected to the first electric circuit 31 (see FIG. 3), the connection member 53 for the electrode portions 13*b* and 13*c* and the leaf spring 11*b* are not necessary. In contrast, if the conductive frame body 13*a* is not directly connected to the first electric circuit 31, it may be possible that the leaf spring 11*b*, with which the connection member 53 of the electrode portions 13*b* and 13*c* is brought into direct contact, is provided, and such a leaf spring 11*b* is electrically connected to the first electric circuit 31.

Such a substrate cover 13 of this structure is disposed on the substrate W in the storage chamber or the like, and the substrate W covered by the substrate cover 13 is mounted on the stage 11. When it is confirmed that at least one of two electrode portions 13*b* and 13*c* is electrically connected to the surface of the substrate W, the drawing is started on the substrate W on the stage 11. While the drawing is performed, the surface of the substrate W is grounded, as at least one of the two electrode portions 13*b* and 13*c* is grounded, and charging of the surface of the substrate W can be prevented. In addition, because scattered electrons in the vicinity of the circumference edge of the substrate W can also be captured by the substrate cover 13, the charging of the substrate W in the vicinity of the circumference edge thereof is prevented. In particular, the gap between the conductive frame body 13*a* and the conductive member main body 51*d* in the notch portion 42 is covered by the brim portion 51*b* and the bank portion 51*c* to prevent entrance of the electrons into such gaps.

Figure 8:
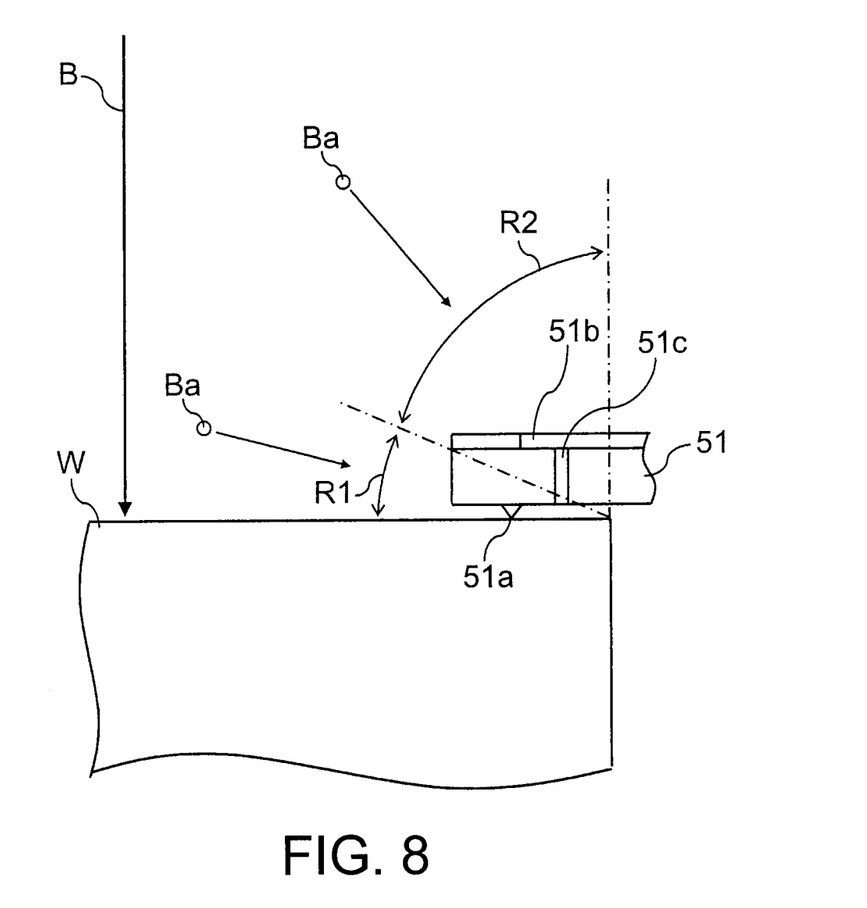
FIG. 8 is an explanatory view illustrating how the substrate is prevented from being charged by a brim portion and a bank portion of the conductive member according to the embodiment.

For example, as illustrated in FIG. 8, entrance of electron Ba into the gap between the conductive member main body 51*d* and the conductive frame body 13*a* is restricted by the brim portion 51*b* and the bank portion 51*c*. The bank portion 51*c* prevents entrance of the electron Ba at an angle within a predetermined range R1 (e.g., in the rage up to about 30 degrees from the surface of the substrate W). The brim portion 51*b* prevents entrance of the electron Ba at an angle within the remaining predetermined range of angles R2 (e.g., in the range of about 30 degrees to 90 degrees). By the presence of such brim portions 51*b* and bank portions 51*c*, the entrance of electrons into the gap between the conductive frame body 13*a* and the conductive member main body 51*d* is restricted, and the charging of the outer peripheral surface of the substrate W is prevented.

The conductive member 51 is formed in the recessed portion 43, and such a conductive member 51 formed in the recessed portion 43 extends to the side of the substrate W through the notch portion 42. That is, the conductive member 51 does not extend to the side of the substrate W beyond (or overlapping) the upper surface of the conductive frame body 13*a*, such that the thickness of the substrate cover 13 can be decreased correspondingly. Specifically, if the notch portion 42 is not present in the conductive frame body 13*a*, the conductive member 51 provided in the recessed portion 43 extends toward the side of the substrate W over the upper surface of the conductive frame body 13*a*. At this time, the conductive member 51 and the conductive frame body 13*a* are provided at a distance to prevent contact therebetween. Accordingly, however, the thickness of the substrate cover 13 is increased corresponding to the distance and the thickness of the conductive member 51. Meanwhile, if the notch portion 42 is provided in the conductive frame body 13*a*, the conductive member 51 provided in the recessed portion 43 as described above extends toward the side of the substrate W through the notch portion 42. Therefore, the conductive member 51 does not exceed the upper surface of the conductive frame body 13*a*, and the overlap, which occurs in the absence of the notch portions 42 between the upper surface of the conductive frame body 13*a* and the conductive member 51, is eliminated. Accordingly, the thickness of the substrate cover 13 can be decreased. Therefore, it is possible to decrease, as described above, the thickness of the substrate cover 13, while preventing the charging of the substrate W.

As described above, according to the embodiment, the notch portion 42 is formed in the inner circumference of the conductive frame body 13*a*, and the plate-like conductive member 51 is provided in the recessed portion 43, which is formed adjacent to the notch portion 42, to cover the surface circumference edge region of the substrate W exposed from the notch portion 42. The conductive member 51 extends toward the side of the substrate W through the notch portion 42. Accordingly, the thickness of the substrate cover 13 can be decreased compared to the case (i.e., the overlapping case) where the notch portion 42 is not provided and the conductive member 51 exceeds the upper surface of the conductive frame body 13*a*. Further, the brim portion 51*b* that extends to the side of the conductive frame body 13*a* to cover the gap up to the conductive frame body 13*a* is provided. Accordingly, the entrance of electrons into the gap between the conductive frame body 13*a* and the conductive member main body 51*d* is restricted by the brim portion 51*b*, and the charging of the substrate W can be prevented. From the above, the thickness of the substrate cover 13 can be decreased as well as preventing the charging of the substrate W.

In addition, the bank portion 51*c* is provided on the conductive member 51 to cover the gap up to the tip end surface on the side of the substrate W of the conductive frame body 13*a*. Accordingly, the entrance of electrons into the gap between the conductive member 51 and the conductive frame body 13*a* can be restricted reliably by the bank portion 51*c*, and the charging of the substrate W can be reliably prevented.

The contact portion 51*a* touches the position on the surface of the substrate W opposing one support pin 11*a* of the plurality of support pins (support points) 11*a*, which support the substrate W from behind, to which the substrate cover 13 is attached. Therefore, the flexure or distortion of the substrate W can be suppressed compared to the case where the contact portion 51*a* touches the position not opposing the support pin 11*a* on the surface of the substrate W.

The first fixing member 54 penetrates through the conductive frame body 13*a* from behind to proceed halfway through the inside of the conductive member 51, to thereby fix the conductive member 51 to the conductive frame body 13*a* by the first fixing member 54. At this time, the first fixing member 54 is not exposed from the upper surface of the conductive member 51. Even when particles are generated due to the friction caused by vibrations or the like between the first fixing member 54 and the conductive member 51, the first fixing member 54 does not project externally from the upper surface of the conductive member 51, and the surface of the substrate W is not contaminated by the particles. Therefore, the contamination of the substrate W can be prevented more effectively than the case where the first fixing member 54 has penetrated through the conductive member 51 and is exposed from the upper surface thereof.

In the embodiment described above, the first fixing member 54 is provided so as not to be exposed from the upper surface of the conductive member 51, but it is not limited thereto. Alternatively, the first fixing member 54 may be exposed from the upper surface of the conductive member 51, when there is no problem of particles or the like.

The embodiments of the present invention have been described, but these are provided only as examples and do not intend to limit the scope of the invention. These new embodiments may be implemented in many ways, and various omissions, replacement, and changes may be possible without departing from the spirit of the present invention. These embodiments and variations thereof are included in the scope and spirit of the invention, and also included in the invention as recited in the appended claims and an equivalent range thereof.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A substrate cover comprising:
a conductive frame body covering a surface circumference edge region and an upper circumference region of a substrate drawn with a charged particle beam, the conductive frame body comprising, a notch portion provided at part of an inner circumference of the conductive frame body, and a recessed portion provided on the outer circumference side of the upper surface of the conductive frame body, such that the recessed portion is arranged adjacent to the notch portion in a direction of a frame width of the conductive frame body; and a first conductive member provided on the recessed portion so as to pass through the notch portion to project inward to the inside of the frame of the conductive frame body, the first conductive member comprising a conductive member main body, a contact portion electrically connected to the surface of the substrate, and a brim portion covering an upper portion of a gap between an inner wall of the notch portion and the conductive member main body, the brim portion extending in a direction of the conductive frame body.

2. The substrate cover according to claim 1, wherein the recessed portion is arranged to follow the inner wall of the notch portion.

3. The substrate cover according to claim 1, wherein the brim portion covers the upper portion of the gap between the inner wall of the recessed portion and the first conductive member main body.

4. The substrate cover according to claim 3, wherein the brim portion extends in a direction of the frame width of the conductive frame body.

5. The substrate cover according to claim 1, wherein the first conductive member is a plate-like member configured to cover at least the surface circumference edge region of the substrate exposed from the notch portion.

6. The substrate cover according to claim 1, wherein the first conductive member includes a bank portion configured to cover the inner circumference side of the conductive frame body of the gap between the inner wall of the notch portion and the conductive member main body.

7. The substrate cover according to claim 1, wherein the bottommost surface of the first conductive member is located lower than the uppermost surface of the conductive frame body.

8. The substrate cover according to claim 1, further comprising:

an insulation member arranged between the first conductive member and the conductive frame body, wherein the conductive member is electrically insulated from the conductive frame body by the insulation member.

9. The substrate cover according to claim 1, further comprising:

a second conductive member arranged between the first conductive member and the conductive frame body, the first conductive member being electrically connected to the conductive frame body by the second conductive member.

10. The substrate cover according to claim 1, wherein the conductive frame body includes a plurality of notch portions that includes the notch portion and a plurality of recessed portions that includes the recessed portion, each of the recessed portions corresponding to the respective notch portions, and a plurality of conductive members that includes the first conductive member are provided corresponding to the respective recessed portions.

11. The substrate cover according to claim 1, wherein the contact portion touches a surface position of the substrate to which the substrate cover is attached, the surface position facing a support point of a plurality of support points that support the substrate from behind.

12. The substrate cover according to claim 1, further comprising:

a fixing member configured to fix the first conductive member to the conductive frame body by penetrating through the conductive frame body from behind to proceed halfway through the inside of the first conductive member.

* * * * *